United States Patent [19]

Noda

[11] Patent Number: 5,260,894

[45] Date of Patent: Nov. 9, 1993

[54] SEMICONDUCTOR MEMORY DEVICE

[75] Inventor: Masanori Noda, Kanagawa, Japan

[73] Assignee: Sony Corporation, Tokyo, Japan

[21] Appl. No.: 903,497

[22] Filed: Jun. 24, 1992

[30] Foreign Application Priority Data

Jun. 25, 1991 [JP] Japan ................... 3-180132

[51] Int. Cl.⁵ ............................. G11C 5/06
[52] U.S. Cl. .................... 365/182; 365/185; 365/63
[58] Field of Search ............ 365/63, 182, 185

[56] References Cited

U.S. PATENT DOCUMENTS 4,500,975  2/1985  Shirato .................. 365/104
4,760,554  7/1988  Schreck et al. ............ 365/51
4,780,846  10/1988  Tanabe et al. ............ 365/63

Primary Examiner—Eugene R. LaRoche
Assistant Examiner—Viet Q. Nguyen
Attorney, Agent, or Firm—Hill, Steadman & Simpson

[57] ABSTRACT

According to this invention, a semiconductor nonvolatile memory is formed as follows. In an EPROM memory array consisting of MIS transistors arranged in a matrix form, a first bit line consisting of polysilicon is connected to a drain region through a first contact formed in the drain region, a second bit line formed on the first bit line through an interlayer insulator by a metal film is connected to the first bit line by a second contact, and the second contact is formed on each source line of the memory array.

3 Claims, 4 Drawing Sheets

SEMICONDUCTOR MEMORY DEVICE

BACKGROUND OF THE INVENTION

1. Field of the Invention

The present invention relates to a semiconductor memory device such as a floating-gate type non-volatile semiconductor memory device and a read-only memory device.

2. Description of the Prior Art

In a floating-gate type non-volatile semiconductor memory device, a stacked gate structure obtained by stacking a control gate on a floating gate has been examined to decrease a memory cell area and to improve an integration level. FIGS. 1 to 3 show a conventional NOR EPROM which is a kind of a non-volatile semiconductor memory device having such a structure.

In this prior art, an $SiO_2$ film 12 is formed on the surface in the field region of an Si substrate 11, and first and second polysilicon films 13 and 14 formed on the Si substrate 11 serve as a floating gate and a control gate i.e., a word line, respectively. $N^+$-type regions 15 and 16 are formed in active regions on both the sides of the polysilicon films 13 and 14, and the polysilicon films 13 and 14 are covered with an interlayer insulator 17 and a planarizing film 18.

A contact hole 21 reaching the $n^+$-type region 15 is formed in the planarizing film 18 and the interlayer insulator 17, and an Al film 22 serving as a bit line is connected to the $n^+$-type region 15 through the contact hole 21. Therefore, the $n^+$-type region 15 serves as a data output electrode of a memory cell, and the $n^+$-type region 16 serves as a ground line.

Although the Al film 22 is formed by sputter deposition, the Al film 22 is originally poor in step coverage. Furthermore, since the contact hole 21 has a large step difference in the stacked gate structure described in this prior art, the step coverage of the Al film 22 is further degraded. For this reason, as shown in FIG. 2, since a size l of the contact hole 21 itself and a size d of each of marginal regions, for planarization, ensured on both the sides of the contact hole 21 cannot be decreased, an integration level cannot be easily improved.

Since the peripheral portion of the contact hole 21 is planarized by a flow or the like as described above, in a lithographic process for patterning the Al film 22, a sharp signal for mask alignment cannot be obtained. For this reason, as shown in FIG. 3, a size o of each of marginal regions, for mask alignment, ensured on both the sides of the contact hole 21 cannot be decreased, and an integration level cannot be easily improved.

In addition, as is apparent from FIG. 1, since the contact holes 21 are adjacent to each other in a direction perpendicular to an extending direction of the Al film 22, an interval s between the Al films 22 is minimum at this position. In addition, as described above, a size l' of the contact hole 21 itself and the size o of each of the marginal regions cannot be decreased. For this reason, an integration level cannot be easily improved in this portion.

As is apparent from FIGS. 1 and 2, there are a large number of contact holes 21 for the Al films 22, i.e., each of the contact holes 21 is formed in memory cells corresponding to two bits. As described above, the Al film 21 is poor in step coverage. For this reason, the above prior art has poor reliability.

SUMMARY OF THE INVENTION

Conductive films 23 are connected to date output electrodes 15, and bit lines 22 are connected to the conductive films 23 through contact holes 26 smaller in number than the data output electrodes 15.

In addition, each contact hole 26 is arranged in every other bit lines in a direction perpendicular to an extending direction of the bit lines 22.

In a floating gate type non-volatile semiconductor memory device having the above arrangement, since the data output electrodes 15 of the memory cells and the bit line 22 ar electrically connected to each other through the conductive film 23, a film having good step coverage can be selected as the conductive film 23. As a result, a small contact hole 21 may be used in the data output electrode 15, and the peripheral portion of each of the contact holes 21 may have a low degree of planarization. Therefore, the size of the contact hole 21 itself and the marginal regions around the contact hole 21 can be decreased.

Since the conductive films 23 and the bit lines 22 are connected to each other by the contact holes 26 smaller in number than the data output electrodes 15, a small number of contact holes 26 may be used for the bit lines 22.

According to the present invention, an interval between the bit lines 22 can be decreased compared with a case wherein the contact holes 26 for the bit lines 22 are arranged adjacent to each other in a direction perpendicular to an extending direction of the bit lines 22.

DETAILED DESCRIPTION OF THE PREFERRED EMBODIMENT

An embodiment in which the present invention is applied to an NOR EPROM having a stacked gate structure will be described below with reference to FIGS. 4 and 5.

Figure 1:
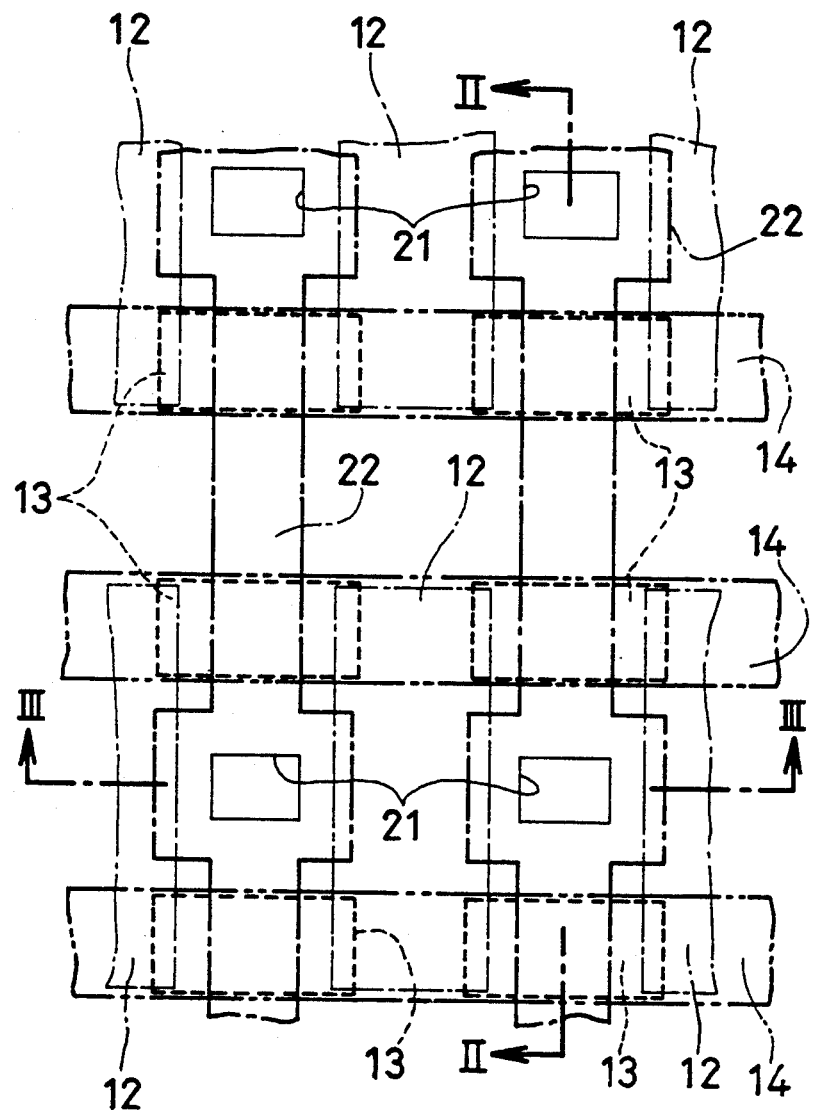
FIG. 1 is a plan view of a part of a prior art EPROM.
Figure 2:
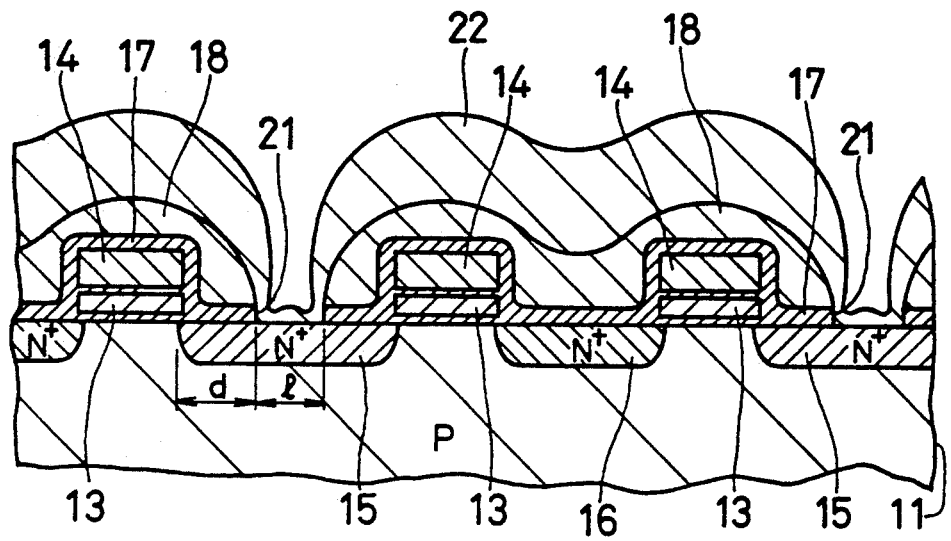
FIG. 2 to 3 are sectional views of a part of the prior art EPROM shown in FIG. 1 along lines II—II and III—III, respectively.
Figure 3:
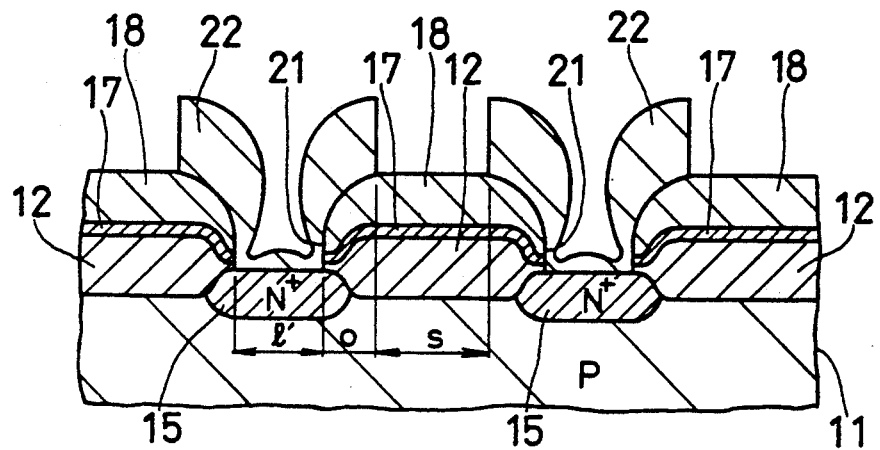

In this embodiment, an $SiO_2$ film 12 in a field region, polysilicon films 13 and 14 respectively serving as floating and control gates, $n^+$-type regions 15 and 16 respectively serving as a data output electrode and a ground line, and contact holes 21 are arranged in substantially the same manner as that of the prior art shown in FIGS. 1 to 3.

In this embodiment, each of polycide films 23 consisting of a polysilicon film and a WSi film is formed below each of Al films 22 serving as bit lines and along the Al films 22 to cover memory cells corresponding to four bits. As is apparent from FIG. 4, the polycide films 23 are patterned to be arranged in every other Al films 22 in a direction perpendicular to an extending direction of the Al films 22.

One of the patterned polycide films 23 is connected to two of the $n^+$-type regions 15 through two of the contact holes 21. Each of the polycide films 23 is converted with an interlayer insulator 24 and a planarizing film 25.

The central portion of each of the polycide films 23 in the extending direction of the Al films 22 is located on the n+-type region 16. A contact hole 26 is formed in the planarizing film 25 and the interlayer insulator 24 on the central portion to reach the polycide film 23, and the Al film 22 is connected to the polycide film 23 through the contact hole 26. Therefore, each contact hole 26 is arranged for memory cells corresponding to four bits in an extending direction of the Al film 22, and each contact hole 26 is arranged in every other Al films 22 in a direction perpendicular to the extending direction of the Al films 22.

In the above described embodiment, the n+-type region 15 is electrically connected to the Al film 22 through the polycide film 23, and the polycide film 23 formed by a CVD method is excellent in step coverage. For this reason, a size l of the contact hole 21 itself shown in FIG. 2 and a size d of each of marginal regions, for planarization, ensured on both the sides of the contact hole 21 can be decreased compared with the above-described prior art.

The contact hole 26 around which a wiring line is not arranged is shallower than the contact hole 21 arranged between the polysilicon films 13 and 14. For this reason, in this embodiment, the size of the contact hole 26 itself can be decreased compared with the size l of the contact hole 21 itself in the above described prior art.

The contact hole 26 around which no wiring line is located is shallower than the contact hole 21 arranged between the polysilicon films 13 and 14. For this reason, as compared with the size l of the contact hole 21 itself in the prior art, the size of the contact hole 26 can be decreased.

As described above, since a degree of planarization around the contact hole 21 can be set to be lower than that of the above described prior art, a sharp signal for mask alignment can be obtained in a lithographic process for patterning the polycide film 23. For this reason, the size o of each of marginal regions, for mask alignment, ensured on both the sides of the contact hole 21 shown in FIG. 3 can be decreased.

Since the contact hole 26 is shallower than the contact hole 21, a degree of planarization around the contact hole 26 may be set to be lower than a degree of planarization around the contact hole 21 of the above prior art. For this reason, in a lithographic process for patterning the Al films 22, a sharp signal for mask alignment can be obtained. Therefore, a size of each of marginal regions, for mask alignment, ensured on both the sides of the contact hole 26 can be decreased compared with the size o shown in FIG. 3.

Figure 4:
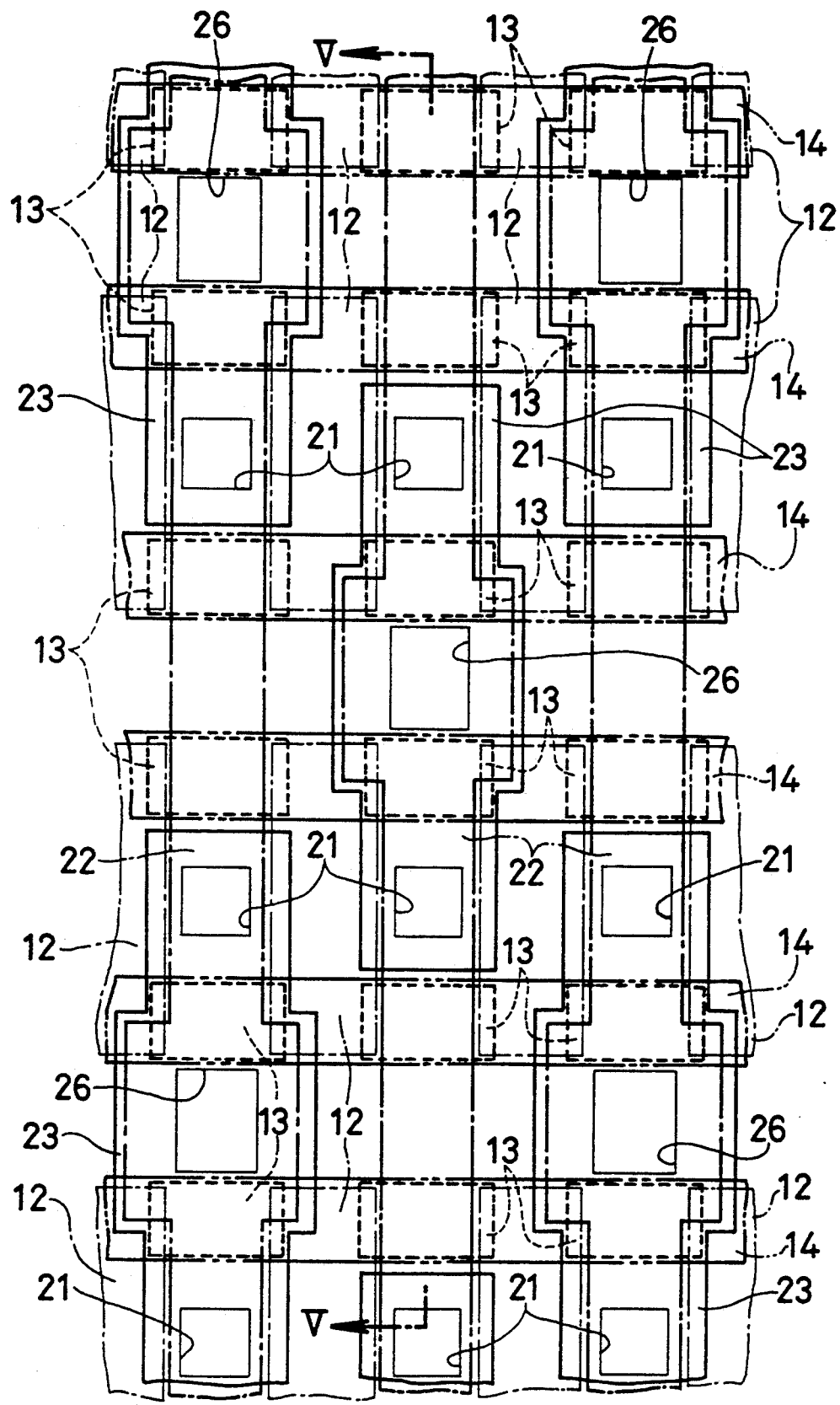
FIG. 4 is a plan view of a part of the ROM according to the Invention.

As is apparent from FIG. 4, since each contact holes 26 is arranged in every other Al films 22 in a direction perpendicular to an extending direction of the Al films 22, the contact holes 26 do not seriously cause to decrease an interval between the Al films 22.

Figure 5:
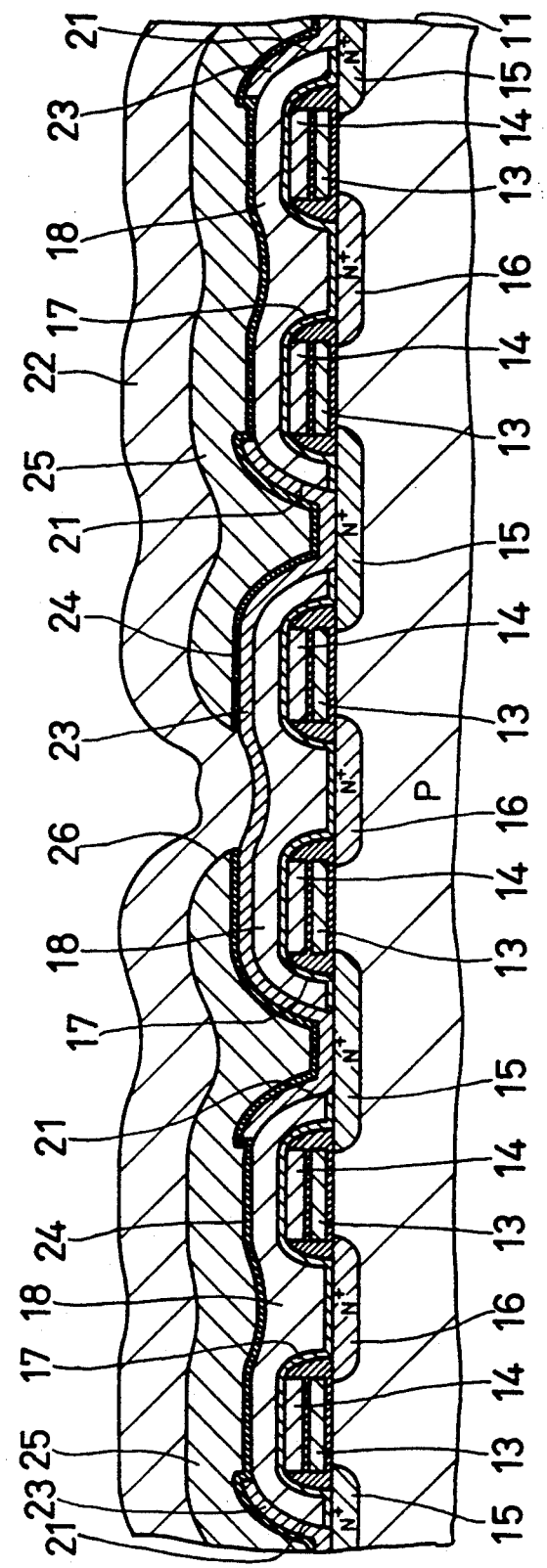
FIG. 5 is a sectional view of a part of the ROM shown in FIG. 4 along a line V—V.

As is apparent from FIGS. 4 and 5, since each of the contact holes 26 for the Al films 22 is arranged on memory cells corresponding to 4 bits, the number of the contact holes 26 is half the number of the contact holes 21 of the above prior art. For this reason, the memory of this embodiment has reliability higher than that of the memory of the above prior art.

In the above embodiment, although each of the polycide films 23 is formed on memory cells corresponding to four bits, each of the polycide films 23 may be formed on memory cells corresponding to five or more bits, and the polycide films 23 may be formed without being cut along the Al films 22. In addition, although each of the contact holes 26 is formed on memory cells corresponding to four bits in an extending direction of the Al films 22, the number of the contact holes 26 has only to be smaller than that of the contact holes 21.

Although the polycide film 23 is used for electrically connecting the n+-type region 15 and the Al film 22, a film having good step coverage, e.g., a polysilicon film formed by a CVD method, a refractory metal film, or the like, can be used in place of the polycide film 23.

In the above embodiment, although the present invention is applied to an NOR EPROM, the present invention may also be applied to a mask programmable ROM.

What is claimed is:

1. A semiconductor memory device comprising:
   a plurality of word lines;
   a plurality of first bit lines arranged in a direction perpendicular to said word lines;
   source lines parallelly arranged to said word lines and each source line is formed on a semiconductor substrate by an impurity diffused region of a conductivity type opposite to that of said semiconductor substrate;
   second bit lines arranged on said first bit lines through an interlayer insulator parallelly to said first bit lines to be opposite to said first bit lines;
   a plurality of memory cells arranged in an array and each consisting of a MIS transistor, a control electrode of which is one of said word lines, a drain region of which has a first contact for outputting data, and a source region of which is commonly used as one of said source lines and as a source region of an adjacent memory cell in an extending direction of said first bit lines,
   wherein said drain regions of said memory cells and said first bit lines are connected to each other by said first contacts, and said first bit lines and said second bit lines are connected to each other through respective second contacts.

2. A device according to claim 1, wherein each of said second contacts, is formed at a position planarly overlapping and lying on each of said source regions.

3. A device according to claim 1, wherein each of said first bit lines is formed by a conductive layer including a polysilicon film, and each of said second bit lines is formed by a metal layer.

* * * * *